United States Patent

[11] 3,579,272

[72] Inventor Richard Charles Foss
Ilford, Essex, England
[21] Appl. No. 798,714
[22] Filed Feb. 12, 1969
[45] Patented May 18, 1971
[73] Assignee The Plessey Company Limited
Essex, England
[32] Priority Feb. 16, 1968
[33] Great Britain
[31] 7833/68

[54] LOGIC CIRCUITS
6 Claims, 4 Drawing Figs.

[52] U.S. Cl. .......... 307/218, 307/297, 307/310, 307/215
[51] Int. Cl. .......... H03k 19/20, H03k 1/12
[50] Field of Search .......... 307/310, 297, 218; 307/215; 330/300

[56] References Cited

UNITED STATES PATENTS

| | | | |
|---|---|---|---|
| 3,259,761 | 7/1966 | Naryd | 307/297 |
| 3,263,156 | 7/1966 | Isaacs | 307/297 |
| 3,443,202 | 5/1969 | Moulton | 307/297 |

*Primary Examiner*—Donald D. Forrer
*Assistant Examiner*—David M. Carter
*Attorney*—Blum, Moscovitz, Friedman, Blum and Kaplan

ABSTRACT: An emitter coupled logic circuit comprises a long-tailed pair switch defined by transistors connected respectively to output transistors in emitter follower configuration. A $V_{BE}$ variation with temperature of said output transistors being compensated for by further transistors whose bases are provided with a constant voltage supply.

LOGIC CIRCUITS

This invention relates to logic circuits and more particularly it relates to emitter coupled logic circuits.

One kind of emitter coupled logic circuit with which this invention is concerned comprises a transistor long-tailed pair which forms a current switch wherein a switching level is defined by a reference voltage at the base contact of one transistor of the pair and wherein a logic output is derived from the collector contact of each transistor of the pair via an emitter follower circuit such that if an upper logic level obtains at the output terminal of one emitter follower a lower logic level obtains at the output terminal of the other emitter follower. The logic level output from a given emitter follower circuit is thus dependent on the relationship between the reference voltage applied to the base contact of the said one transistor and a gate voltage applied to the base contact of the other transistor of the pair. This kind of emitter coupled logic circuit is very well known but it has certain inherent disadvantages one of the most serious of which is the adverse effect of temperature changes on the logic level outputs from the emitter follower. It is an important object of the present invention to provide an emitter coupled logic circuit wherein this disadvantage is substantially removed.

According to the present invention, an emitter coupled logic circuit comprises a current switch responsive to the relationship between a gating signal and a reference signal for producing one or the other of two logic levels at the base terminal of a transistor connected in emitter follower configuration to provide output logic levels at its emitter contact and compensation means for changing with temperature the voltage at the base of said transistor to compensate for similar voltage changes with temperature obtaining across the base-emitter junction of said transitor, thereby to provide a logic level output at said emitter which is substantially constant with temperature.

The current switch may take the form of a transistor long-tailed pair, the "tail" current of which is maintained substantially constant by current stabilizing means connected to the emitter contacts of the transistor of the pair and wherein a reference voltage applied to the base contact of one transistor of the pair so as to define the switching threshold of the switch, is derived from voltage stabilizing means.

The compensation means may include a transistor herein called a compensation transistor having electrical characteristics similar to those of the transistor forming the emitter follower, the base of this compensation transistor being connected to a constant voltage derived from said voltage stabilizing means, the collector of this compensation transistor being connected to a load component of the long-tailed pair to which the base of said emitter follower is connected thereby to draw through said load component a current, which is dependent on temperature, and is of a magnitude such as to compensate for voltage changes with temperature across the base emitter junction of the transistor forming said emitter follower. The current stabilizing means connected to provide a constant current in the "tail" of said transistor long-tailed pair may comprise a transistor herein called a stabilizing transistor the collector of which is connected to the emitters of the pair and the emitter of which is connected by a resistor to one supply rail and the base of which is supplied with a substantially constant voltage from said voltage stabilizing means.

It will be appreciated therefore that if the current in the "-tail" of the transistor long-tailed pair is defined independently of temperature variations, and the voltage reference level which is applied to the base of one transistor of the pair is also defined independently of temperature variation and additionally the voltage change across the base-emitter terminals of each output emitter follower is compensated for, an arrangement will be arrived at which will operate substantially independently of temperature variations to provide substantially constant logic levels.

The word transistor as used herein is intended to include transistor devices forming part of an integrated logic circuit structure as well as transistors manufactured as individual units which may be sold separately.

Logic circuits according to the present invention are especially suitable for integrated circuits since it is easy with integrated circuit techniques to fabricate identical or closely similar transistors which enable an important object of this invention to be realized as will hereinafter be explained.

Some exemplary embodiments of the invention will now be described with reference to the accompanying drawings in which.

Figure 1:
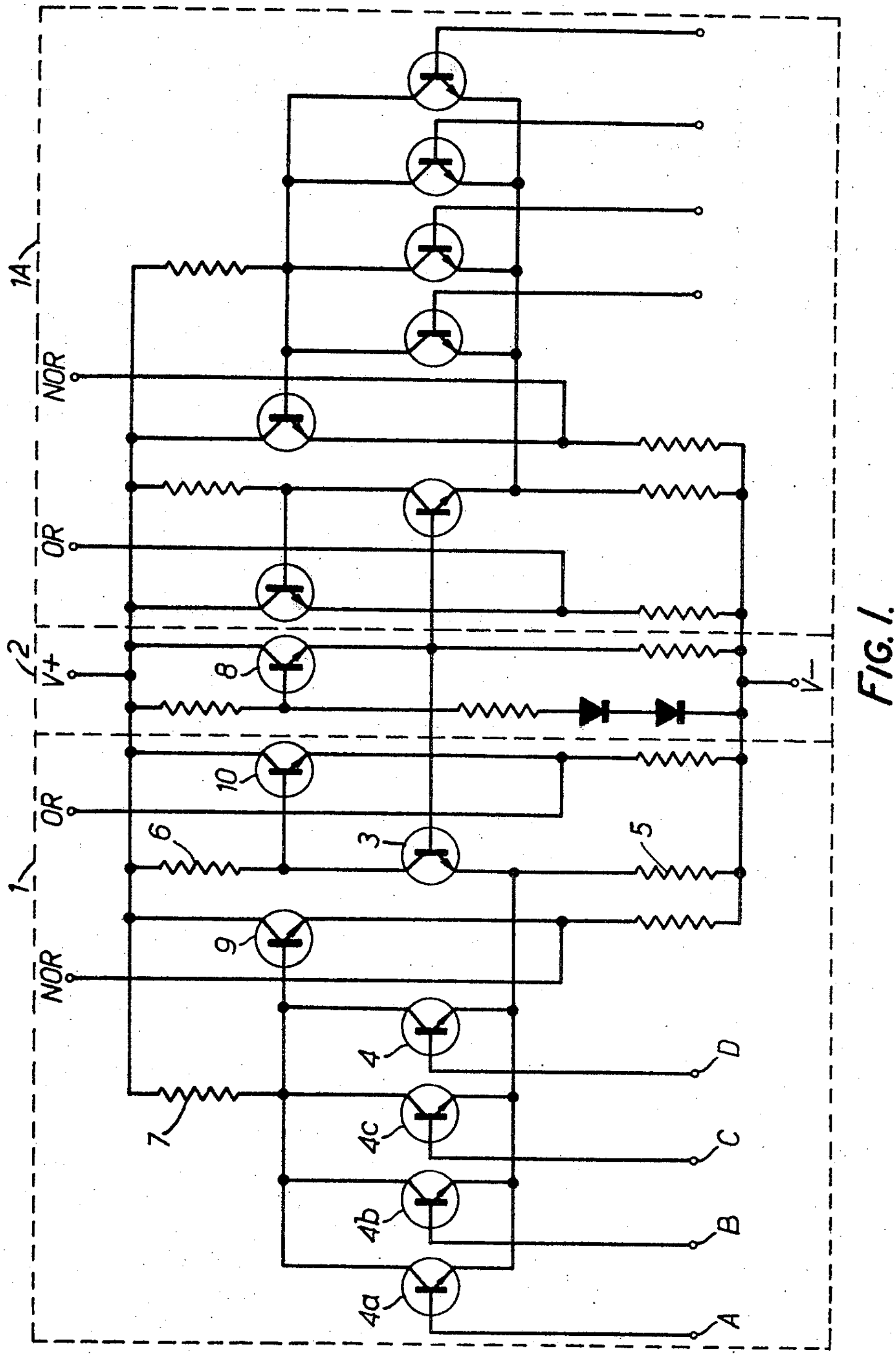
FIG. 1 is a circuit diagram of a known emitter coupled logic circuit.

The circuit of FIG. 1 is an emitter coupled logic arrangement which comprises two similar sections which are shown respectively in dashed boxes 1 and 1A and a voltage defining circuit shown in dashed box 2. Since the circuits of FIG. 1 and 1A are identical the following discussions will be concerned only with the circuit shown in dashed box 1. This circuit comprises a long-tailed pair defined by transistor 3 and are (as will hereinafter be described) of transistor 4, 4*a*, 4*b* or 4*c* which are connected in parallel. A "tail" resistor 5 is connected between a negative supply rail and the emitter contacts of transistors 4*a*, 4*b*, 4*c*, 4 and 3 of the long-tailed pair and load resistors 6 and 7 are connected respectively to the collectors of transistors 3 and to the interconnected connection of transistor 4*a*, 4*b*, 4*c* and 4 of the pair. The base contact of transistor 3 is connected to the emitter contact of transistor 8 which forms part of the voltage defining circuit 2, whereby the voltage applied to the base of transistor 3 is defined, so as to define the switching level of the long-tailed pair. The voltages developed across resistors 6 and 7 of the long-tailed pair are supplied via transistors 9 and 10 connected in emitter follower fashion to provide respectively NOR and OR output terminals. Thus if the voltage applied to any one of input terminals A, B, C or D which are connected to the base contacts of transistors 4*a*, 4*b*, 4*c* and 4 respectively exceeds the reference voltage applied to the transistor 3, the OR output voltage will rise to the upper logic level as transistor 4*a*, 4*b*, 4*c* or 4 as the case may be conducts and the NOR output will fall to the lower logic level, as transistor 3 is cut off.

The operation of circuits of this kind is well-known and further explanation of its operation is believed to be unnecessary for an understanding of the invention. This known circuit arrangement has however some serious disadvantages and one of these disadvantages, which this invention is particularly concerned to obviate, is that the voltage across the base-emitter junction of emitter follower connected transistors 10 and 9 is liable to vary with temperature at the rate of approximately 2 millivolts per degree C. so that if the logic switching threshold is to remain in the middle of the logic swing a similar coefficient should be applied to it. In view of this disadvantage different logic levels must be specified for different temperatures and at high temperatures input transistor saturation can occur.

A further disadvantage associated with the circuit shown in FIG. 1, is that with the simple resistive "tail" afforded by the resistor 5, variations in "tail" current with input voltage and with temperature can occur. The effect of this is to leave the upper logic level changing at about 2 millivolts per degree C. and to reduce the lower logic level. This also renders the circuits still more likely to saturate at high temperatures.

Figure 2:
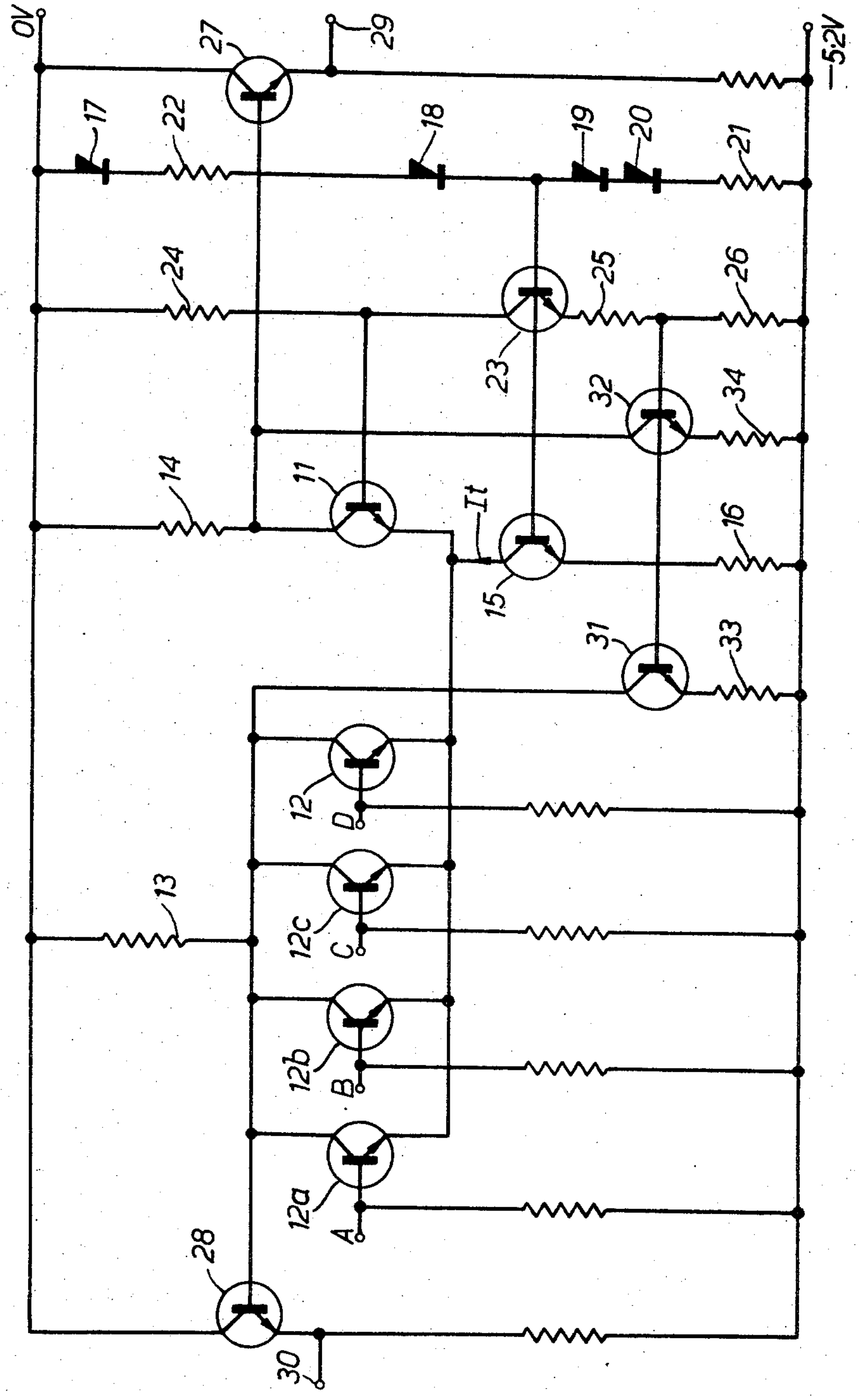
FIG. 2 is a logic circuit according to the present invention.

Referring now to FIG. 2 we show one exemplary circuit according to the invention which substantially overcomes the aforesaid disadvantages of the known arrangement. The long-tailed pair of this circuit is defined by transistors 12*a*, 12*b*, 12*c* and 12, and by transistor 11. The load of transistors 12*a*, 12*b*, 12*c* and 12 which are connected in parallel is a resistor 13 and the load of transistor 11 is a resistor 14. Tail current $I_t$ for the emitter follower is applied to the emitters of transistors 12, 12*a*, 12*b*, 12*c* and 11 through the collector of transistor 15, the emitter of which is connected to a negative supply rail via resistor 16 and the base of which is connected to a constant voltage derived from a bias chain comprising serially connected diodes 17, 18, 19 and 20, and resistors 21 and 22. A transistor 23 is supplied at its base from the junction of the diodes 18 and 19 with a constant voltage. A substantially constant current thus flows through transistors 23 between collector and emitter thereof to afford at the base of a transistor 11 a substantially constant voltage defined between the collector of transistor 23 and resistor 24 connected at its other end to the zero supply rail.

Thus far it will be appreciated that circuitry has been provided for affording a constant "tail" current in the long-tailed pair and a constant reference voltage at the base of transistor 11 to define the switching threshold.

In order to overcome the disadvantage of the variation in base-emitter junction voltage of emitter followers connected transistors 27 and 28 via which output logic levels are applied to terminals 29 and 30 respectively, transistors 31 and 32 are provided and supplied at their respective base connections with a constant voltage via the junction of resistors 25 and 26. The emitters of transistors 31 and 32 respectively are connected to the negative supply rail via resistors 33 and 34 respectively while their collectors are connected respectively to the collectors of transistors 12 and 11.

Consider now the operation of transistors 32 and the manner in which it compensates for changes in voltage across the base-emitter junction of transistor 27. Provided the base-emitter junction voltage of transistor 32 varies with temperature in the same manner as the base-emitter junction voltage of transistor 27, and provided that the emitter resistor 34 of transistor 32 is equal to the collector resistor 14 of transistor 11 any variations with temperature of the voltage across the base emitter of transistor 27 will be compensated for. If for example a constant voltage of 0.8 volt is applied at the base of transistor 32 a voltage of 0.8 volt $-V_{BE}$ (where $V_{BE}$ is the voltage between base and emitter) will obtain at its emitter and since resistor 34 and 14 are equal, a voltage of 0.8 volt $-V_{BE}$ will appear across resistor 14 at the base of transistor 27. It is therefore easy to see that the voltage at the output terminal 29 will be equal to 0.8 of a volt, and this will in fact be the upper logic level the lower logic level being 0.8 of a volt plus the product of the tail current $It$ and the value of resistor 14. If the transistors 32 and 27 are formed by integrated circuit techniques they can be made substantially identical thus facilitating the cancellation of $V_{BE}$ variation with temperature.

Figure 3:
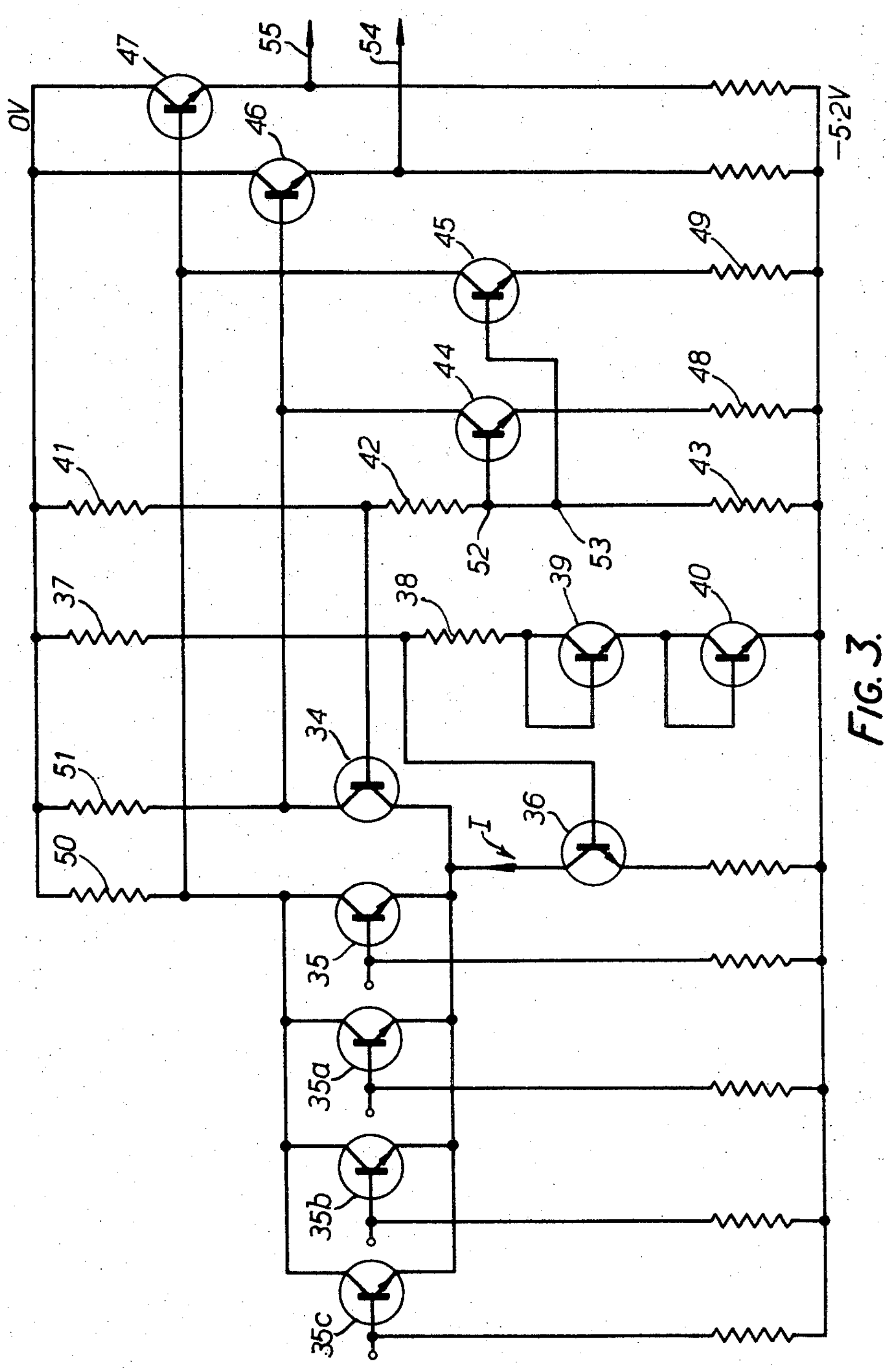
FIG. 3 is an alternative form of logic circuit according to the invention.

FIG. 3 is a circuit diagram of an alternative circuit according to the invention. The precise operation of this circuit will not be explained in any great detail since its manner of operation should be quite apparent from the description of FIGS. 1 and 2. It will be appreciated that the most important features of the invention are included. In particular the tail current I of the transistor long-tailed pair defined by transistors 34, 35, 35*a*, 35*b* and 35*c* is maintained constant by transistor 36 the base voltage of which is defined by a potential divider network comprising resistors 37 and 38 and transistors 39 and 40 serially connected with their base and collector terminals interconnected to define diodes. Resistors 41, 42 and 43 form another potential divider network which defines the reference voltage at the base of transistor 34 of the long-tailed pair and also defines the voltage applied to the base of transistors 44 and 45. Transistors 44 and 45 have similar electrical characteristics to the emitter follower output transistors 46 and 37 and the emitter resistors 48 and 49 of transistors 44 and 45 are arranged to have the same value as load resistors 50 and 51 of the long-tailed pair. It will therefore be appreciated that the voltage which obtains at points 52 and 53 will be the upper logic level obtaining at one or the other of output terminals 54 and 55.

Figure 4:
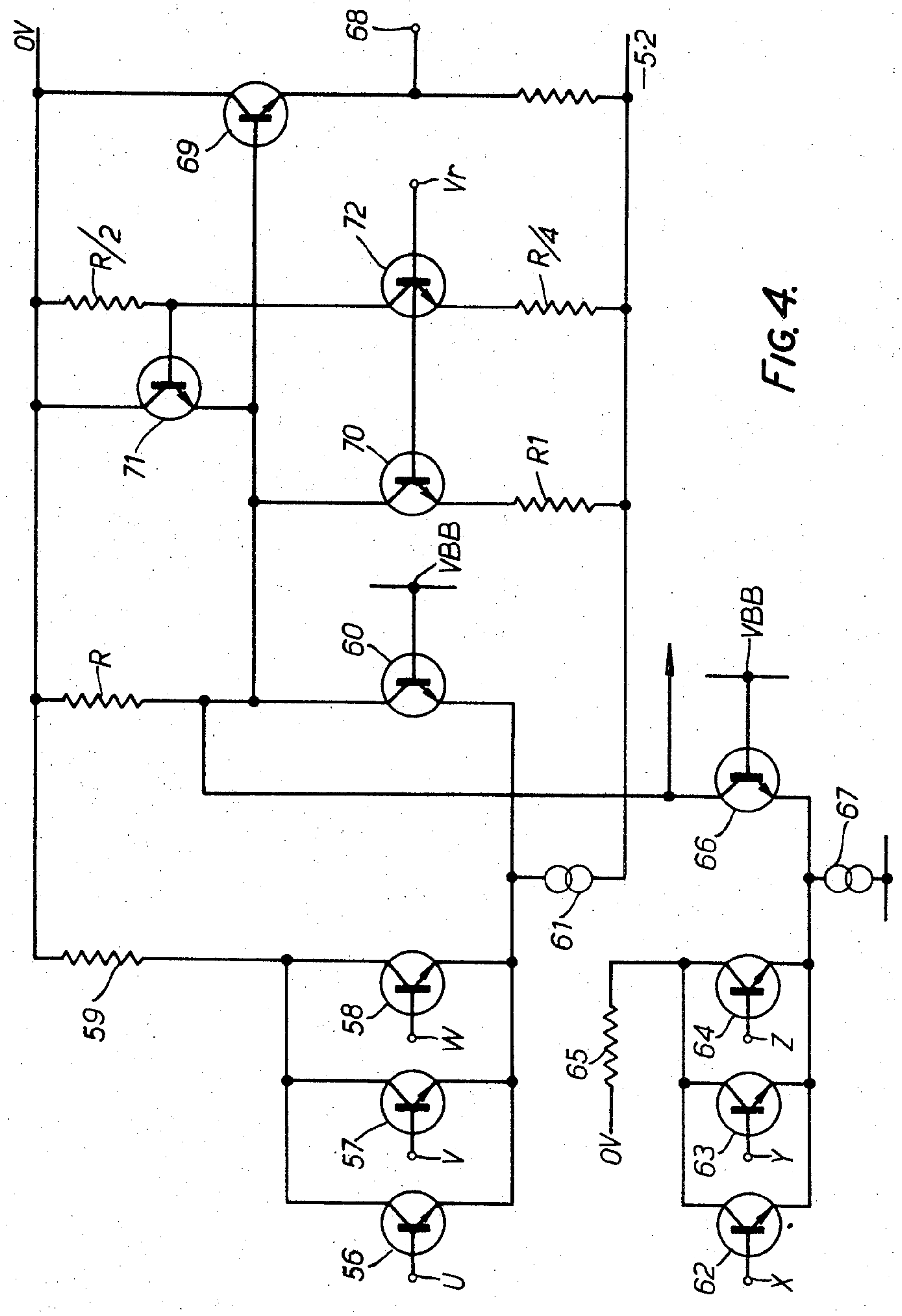
FIG. 4 is a further alternative form of logic circuit.

FIG. 4 shows an AND/OR logic circuit wherein two long-tailed pair arrangements, each affording an OR function, are coupled to a common load component to provide in addition an AND function.

The circuit comprises a first long-tailed pair arrangement consisting of transistors 56, 57 and 58 which afford at their respective bases OR inputs U, V and W, their collectors being coupled to a common load resistor 59. This arrangement of transistors 56, 57 and 58 constitutes one-half of the long-tailed pair, and the other half consists of transistor 60, the base of which is connected to a reference voltage $V_{BB}$ and the collector of which is coupled to a load resistor R. The emitters of transistors 56, 57, 58 and 60 are connected to a constant current source 61.

A second long-tailed pair comprises transistors 62, 63 and 64 which correspond to transistors 56, 57 and 58 and provide OR gate inputs X, Y and Z respectively. A load resistor 65 is coupled to the collectors of transistors 62, 63 and 64 and the other half of the second long-tailed pair is defined by a transistor 66, the emitter of which, together with the emitters of transistors 62, 63 and 64 is connected to a constant current source 67.

The base of transistor 66 is connected to the reference voltage $V_{BB}$ to which the base of transistor 60 is also connected and the collector of transistor 66 is connected to the collector of transistor 60.

It will now be apparent that the circuit will operate as an AND/OR gate and if the U, or V, or W, and X, or Y, or Z, input terminals are taken more positive than $V_{BB}$, transistors 60 and 66 will turn off and the voltage at their collectors will rise to an upper logic level.

Since current for transistors 60 and 66 is supplied through a resistor R the negative logic level which obtains when both transistors are conducting is for many applications likely to be too negative. In this circuit therefore a lower logic level clamps is provided which is temperature compensated, and this will be described later.

The logic level output from the circuit is supplied at terminal 68 via emitter follower connected transistor 69, to the base of which, the logic level developed across the resistor R is supplied. Temperature compensation, as hereinbefore described with reference to FIGS. 2 and 3, is afforded by transistor 70 which is connected at its collector to the base of transistor 69, a resistor R1 which equals R being connected between its emitter and the negative supply rail. The base of transistor 70 is connected to a constant reference voltage $Vr$. It will now be apparent that when transistor 60 is not conducting the upper logic level developed across R may be calculated as follows.

If $Vr$=0.8 volts, the voltage at the emitter of transistor 70 across R1 will be 0.8 volts $-v_{BE}$ (where $V_{BE}$ is the base emitter voltage of transistor 70). The voltage across R will therefore also be 0.8 volts $-V_{BE}$ since R = R1 and if the $V_{BE}$ of transistor 70 equals the $V_{BE}$ of transistor 69 then the upper logic level at the output terminal 68 will be 0.8 volts and $V_{BE}$ will be cancelled. Thus the upper logic level will be substantially independent of temperature. Temperature compensation is thus achieved as hereinbefore described with reference to FIG. 2 and FIG. 3.

The lower logic level as was hereinbefore mentioned is clamped and the clamping circuit comprises transistor 71 the emitter of which is connected to the base of the transistor 69. The collector of the transistor 71 is connected directly to the zero supply rail and the base of the transistor 71 is connected to the junction of a resistor R/2 and the collector of a transistor 72. The base of the transistor 72 is connected to the stable reference voltage $Vr$ and the emitter of the transistor 72 is connected via a resistor R/4 to the negative supply rail.

The negative logic level which obtains at the resistor R and the output terminal 68 may be derived as follows. If the voltage $Vr$ at the base of transistor 72 is 0.8 then the voltage at the emitter of transistor 72 as seen across resistor R/4 equals $0.8-V_E$. The voltage measured across R/2 therefore is $1.6-2V$(where $V_{Be}$ is the voltage across the base emitter junction of transistor 72). If the $V_{BE}$ transistor 71 is equal to the $V_{BE}$ of transistor 72 then the voltage at the emitter of transistor 71 as measured across R (i.e. the lower logic level across R) equals $1.6-V_{BE}$.

It is therefore easy to see that if transistor 69 is closely matched to transistor 71 and 72, $V_{BE}$ will be cancelled and the lower logic level output on terminal 68 will be 1.6 volts.

Thus the lower logic level is clamped by a temperature compensated circuit which clearly has no effect on the previously defined upper logic level.

It will be appreciated by the cognoscenti that other input and output gates may be added to this arrangement without departing from the scope of the invention.

The circuits which have been hereinbefore described with reference to FIG. 2, FIG. 3 and FIG. 4 of the accompanying drawings are eminently suitable for integrated circuit manufacture and the circuits achieve in practice an excellent approximation to an ideal logic circuit in which all logic levels, the switching threshold, noise immunity, and so on are essentially independent of environment. This is of great value to the user but it is also of immense benefit to the manufacturer since his specification and test problems are eased and the tolerancing of the circuits is simpler and not dependent on precise emitter follower voltage base emitter values.

I claim:

1. An emitter coupled logic circuit comprising a long-tailed pair current switch defined by two transistors having load components connected to their respective collectors, current stabilizing means connected to the emitters of said transistors, an emitter follower connected transistor the base of which is connected to the collector of one of the said two transistors, and a compensation transistor having similar electrical characteristics to said emitter follower connected transistor, the collector of said compensation transistor being connected to the collector of the said one of the said two transistors so that when in operation of said logic circuit a stable voltage is applied to the base of said compensation transistor, a current is drawn through the load component connected to the collector of the said one of the said two transistors which is dependent on temperature and which is of a magnitude such as to compensate for the voltage changes with temperature across the base-emitter junction of the transistor which forms the emitter follower.

2. An emitter coupled logic circuit as claimed in claim 1 including voltage stabilizing means to which the base of the said one of the said two transistors and the base of the said compensation transistor is connected.

3. An emitter coupled logic circuit as claimed in claim 2, wherein the current stabilizing means which is connected to provide a constant current in the tail of said transistor long-tailed pair comprises a transistor herein called a stabilizing transistor the collector of which is connected to the emitters of the said pair, the emitter of the stabilizing transistor being connected through a resistor to one supply rail and the base of the stabilizing transistor being supplied with a substantially constant voltage from voltage stabilizing means.

4. An emitter coupled logic circuit as claimed in claim 1 comprising a clamping circuit for limiting at least one logic level afforded by the said circuit to a predetermined level.

5. An emitter coupled logic circuit as claimed in claim 4, wherein the clamping circuit includes temperature compensating means such that the logic level clamped is substantially constant in the presence of temperature variations.

6. An emitter coupled logic circuit as claimed in claim 4 wherein the clamping circuit comprises a first transistor the emitter of which is connected to a load component of the current switch, the base of said first transistor being connected at a junction formed between one end of the first resistor and the collector of a second transistor, the base of which is connected to a reference voltage and the emitter of which is connected to one end of a second resistor, the collector of said first transistor and the other end of the first resistor being connected to one supply rail and the other end of the second resistor being connected to one supply another opposite polarity supply rail.